(12) United States Patent
Wang et al.

(10) Patent No.: US 9,318,571 B2
(45) Date of Patent: Apr. 19, 2016

(54) GATE STRUCTURE AND METHOD FOR TRIMMING SPACERS

(75) Inventors: I-Chang Wang, Tainan (TW); Ming-Tsung Chen, Hsin-Chu Hsien (TW); Ling-Chun Chou, Yunlin County (TW); Po-Chao Tsao, Taipei Hsien (TW); Tsung-Hung Chang, Yunlin County (TW); Hui-Ling Chen, Kao-Hsiung Hsien (TW); Cheng-Yen Wu, Kaohsiung (TW); Chieh-Te Chen, Kaohsiung (TW); Shin-Chi Chen, Tainan County (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 1075 days.

(21) Appl. No.: 12/391,213

(22) Filed: Feb. 23, 2009

(65) Prior Publication Data
US 2010/0213554 A1    Aug. 26, 2010

(51) Int. Cl.
H01L 21/64    (2006.01)
H01L 29/49    (2006.01)
H01L 29/66    (2006.01)

(52) U.S. Cl.
CPC ........ *H01L 29/4983* (2013.01); *H01L 29/6653* (2013.01); *H01L 29/6656* (2013.01)

(58) Field of Classification Search
USPC .............................. 257/900, E21.626, E21.64
See application file for complete search history.

(56) References Cited

U.S. PATENT DOCUMENTS

| | | | |
|---|---|---|---|
| 4,638,347 A | * | 1/1987 | Iyer .................. H01L 29/4983 257/384 |
| 6,444,591 B1 | | 9/2002 | Schuegraf |
| 6,521,964 B1 | | 2/2003 | Jan |
| 6,613,695 B2 | | 9/2003 | Pomarede |
| 6,809,402 B1 | | 10/2004 | Hopper |
| 6,858,506 B2 | | 2/2005 | Chang |
| 6,881,616 B1 | * | 4/2005 | Hellig et al. ............ 438/181 |
| 6,949,482 B2 | | 9/2005 | Murthy |
| 6,975,006 B2 | | 12/2005 | Huang |
| 6,991,979 B2 | | 1/2006 | Ajmera |
| 6,991,991 B2 | | 1/2006 | Cheng |
| 7,060,576 B2 | | 6/2006 | Lindert |
| 7,314,793 B2 | * | 1/2008 | Frohberg ........ H01L 21/823807 257/E21.315 |
| 7,402,496 B2 | | 7/2008 | Liu |
| 2004/0026747 A1 | * | 2/2004 | Maki .............. H01L 21/823425 257/384 |
| 2005/0189660 A1 | * | 9/2005 | Bu et al. .................... 257/900 |
| 2005/0285193 A1 | | 12/2005 | Lee |
| 2006/0094215 A1 | | 5/2006 | Frohberg |
| 2006/0172556 A1 | * | 8/2006 | Bather et al. ............. 438/794 |
| 2007/0034963 A1 | * | 2/2007 | Sudo ......................... 257/369 |
| 2007/0252214 A1 | * | 11/2007 | Zhu ................ H01L 21/823807 257/369 |
| 2008/0014704 A1 | * | 1/2008 | Peidous et al. ............ 438/305 |
| 2008/0142867 A1 | * | 6/2008 | Lee et al. .................. 257/315 |

(Continued)

OTHER PUBLICATIONS

Leon Tang, "Patent of SiGe Process", Invention disclosure, Nov. 8, 2005, p. 1-15.
Leon Tang, "Patent of SiGe Process", Invention disclosure, Nov. 8, 2005, p. 1-8.

(Continued)

*Primary Examiner* — Benjamin Sandvik
(74) *Attorney, Agent, or Firm* — Winston Hsu; Scott Margo

(57) ABSTRACT

A gate structure includes a gate disposed on a substrate, a first spacer disposed on the substrate and surrounding the gate and a second spacer disposed on the first spacer and surrounding the gate, the second spacer is lower than the first spacer.

8 Claims, 4 Drawing Sheets

(56) References Cited

U.S. PATENT DOCUMENTS

2008/0171412 A1  7/2008 Cheng
2008/0237726 A1* 10/2008 Dyer ............................ 257/369

OTHER PUBLICATIONS

Tang Li-yuen et al., "Optimize epitaxy Pre-Clean process to enhance Cap layer remain thickness", Invention disclosure, Nov. 16, 2005, p. 1-4.
Po Lun Cheng, "Stress enhancement profile", Invention disclosure, Jun. 8, 2006, p. 1-6.
Min-Chieh Yang et al., "New method for reducible spacer process", Invention disclosure, Oct. 15, 2007, p. 1-6.
M. Horstmann et al., "Integration and Optimization of Embedded-SiGe, Compressive and Tensile Stressed Liner Films, and Stress Memorization in Advanced SOI CMOS Technologies", 2005, IEEE.
H. Ohta et al., "High Performance 30 nm Gate Bulk CMOS for 45 nm Node with Σ-shaped SiGe-SD", 2005, IEEE.

* cited by examiner

GATE STRUCTURE AND METHOD FOR TRIMMING SPACERS

BACKGROUND OF THE INVENTION

1. Field of the Invention

The present invention relates to a method for trimming spacers and a gate structure. In particular, the present invention relates to a method for trimming spacers to eliminate defects and a gate structure made from such method.

2. Description of the Prior Art

In the manufacturing process of semiconductors, a pair of protective and self-aligning spacers is formed to surround the elements of the semiconductor devices, such as the gates. However, when the spacers are formed, some undesirable side effects happen.

First, the newly formed spacers surrounding the gates make the substrate suffer new stress, in particular at the border of the spacers and the substrate. If the stress has incorrect direction or magnitude, the stress then has adverse influence on the elements in the substrate and on the carrier mobility in the gate channel.

Second, the newly formed spacers surrounding the gates may change the nature of the substrate. For example, the dislocation resulted from the new formation of the spacers may break or mess up the original arrangement of the silicon atoms in the substrate. Even more, the dislocation which breaks or messes up the original arrangement of the silicon atoms in the substrate results in defects and cracks. Later, when salicides are formed, the metallic atoms may take the opportunity to make their way into the substrate along the cracks formed by the dislocation, called salicide piping, and even go further ahead toward the gate channel. As a result, the leak current of the elements increases, the dislocation jeopardizes the performance of the elements and takes its toll on the electronic properties of the MOS.

Therefore, a technical solution is needed to relieve the adverse influence of the spacers on the substrate and to keep the semiconductor elements in good condition.

SUMMARY OF THE INVENTION

The present invention therefore proposes a method for trimming spacers and a gate structure made from such method. By using the method, it can relieve the adverse stress of the new spacers on the substrate, to maintain superior carrier mobility in the gate channel, to avoid leak current and the dislocation, and to keep the semiconductor elements in good condition.

The present invention first proposes a method for trimming spacers. In the method for trimming spacers of the present invention, first a gate structure is provided. The gate structure includes a gate disposed on a substrate, a first spacer disposed on the substrate, surrounding the gate and having a cross section of L shape, and a second spacer disposed on the first spacer and surrounding the gate. Second, a trimming procedure is performed so that the second spacer is lower than the first spacer. Preferably, the trimming procedure is a dry or wet etching step, so that the second spacer is lower than half of the first spacer. Or, the height of second spacer and the first spacer has discontinuous change.

The present invention again proposes a gate structure. The gate structure of the present invention includes a gate disposed on a substrate, a first spacer disposed on the substrate, surrounding the gate and having a cross section of L shape, and a second spacer disposed on the first spacer and surrounding the gate. The second spacer is lower than the first spacer.

Preferably, the second spacer is lower than half of the first spacer, or, the height of second spacer and the first spacer has discontinuous change.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
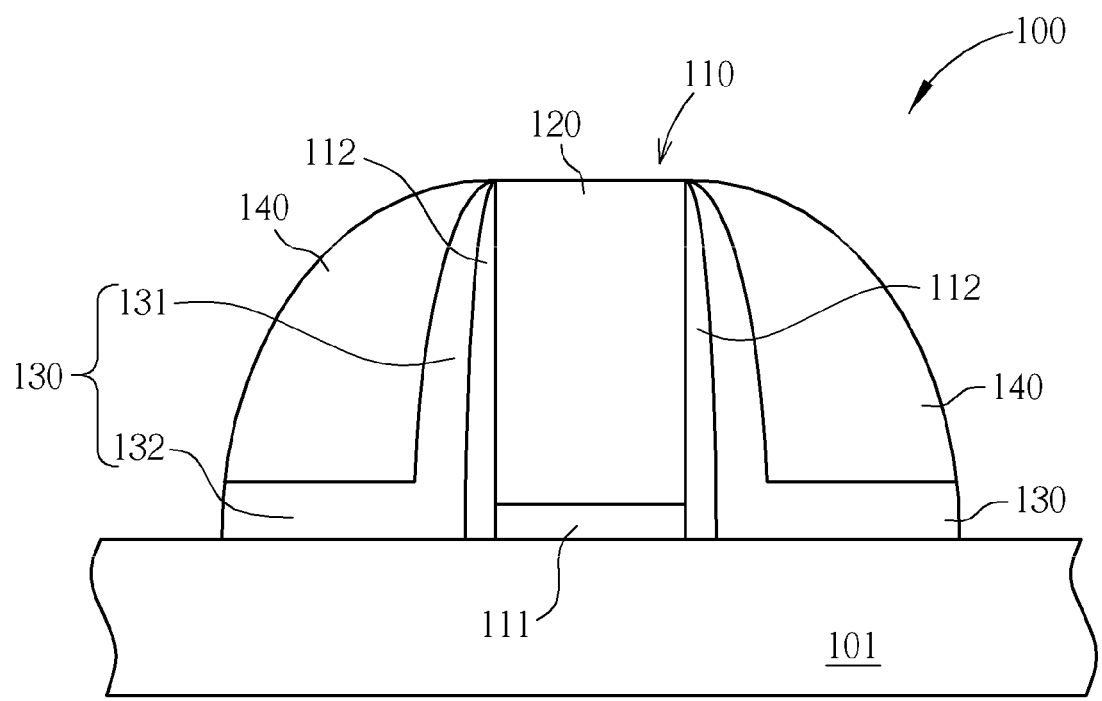
FIGS. 1-4 illustrate preferred examples of the method for trimming spacers of the present invention.

Considering in the prior art the newly formed spacers may have incorrect stress on the substrate in one aspect to have adverse influence on the elements in the substrate and on the carrier mobility in the gate channel, and in another aspect to cause the dislocation in the silicon substrate and higher leak current of the elements, to jeopardize the performance of the elements and to take its toll on the electronic properties of the MOS, the present invention provides a technical solution to relieve the adverse influence of the stress by the spacers on the substrate and to solve the above-mentioned problems.

FIGS. 1-4 illustrate preferred examples of the method for trimming spacers of the present invention. Please refer to FIG. 1, first a substrate 101 is provided. The gate structure 110 is disposed on the substrate 101. The gate structure 110 includes a gate 120, a first spacer 130 and a second spacer 140. In addition, the gate structure 110 may also include a gate insulator 111 and a liner 112. The gate insulator 111 is disposed between the gate 120 and the substrate 101, and usually includes a high-k material or silicon oxide. The liner 112 is disposed between the gate 120 and the first spacer 130, and usually includes a silicon nitride or silicon oxide. Before the formation of the spacers, lightly doped drain (LDD) may be formed. So far, the methods to manufacture the gate 120, and the gate insulator 111 are well known to persons of ordinary skills in the art, and the details will not be discussed here. The liner may be a single layer, a bilayer or a multi-player. The method to form a bilayer liner 112, for example, may be as follows. First, the preliminary shape of the gate 120 is defined. Second, a thermal oxide layer is growth on the gate 120 by a thermal oxide deposition. Third, an oxide or nitride layer is growth by chemical vapor deposition. Finally, the bilayer liner 112 is formed by a back-etching.

The gate 120 is disposed on the substrate 101. The substrate 101 is usually a semiconductor substrate, such as Si. First, the gate 120 is surrounded by the liner 112, then by the first spacer 130, also disposed on the substrate 101. In other words, the liner 112 is disposed between the gate 120 and the first spacer 130. Further, the second spacer 140 is disposed on the first spacer 130 and surrounding the gate 120. The methods to manufacture the first spacer 130 and the second spacer 140 may be as follows. After the completion of the gate 120, a first spacer material layer and a second spacer material layer of a proper thickness are respectively deposited on the substrate 101 and on the gate 120. Then, a back-etching procedure is carried out on the first spacer material layer and on the second spacer material layer deposited on the substrate 101 to leave the second spacer 140 and the first spacer 130 surrounding the gate 120. Also, due to the back-etching procedure on the second spacer 140, the first spacer 130 surrounding the gate structure 110 has a cross section of L shape, that is, the first spacer 130 includes a horizontal part 132 contacting the substrate 101 and a vertical part 131.

As described in the related prior art, because the newly formed second spacer 140 and the first spacer 130 make the substrate 101 suffer new stress and partially change the nature of the substrate 101, the present invention provides a trimming method for adjusting the height of the second spacer 140 and to further lessen the adverse influence of the new stress on the substrate 101. The following are various ways to adjust the height of the second spacer 140.

Figure 2:
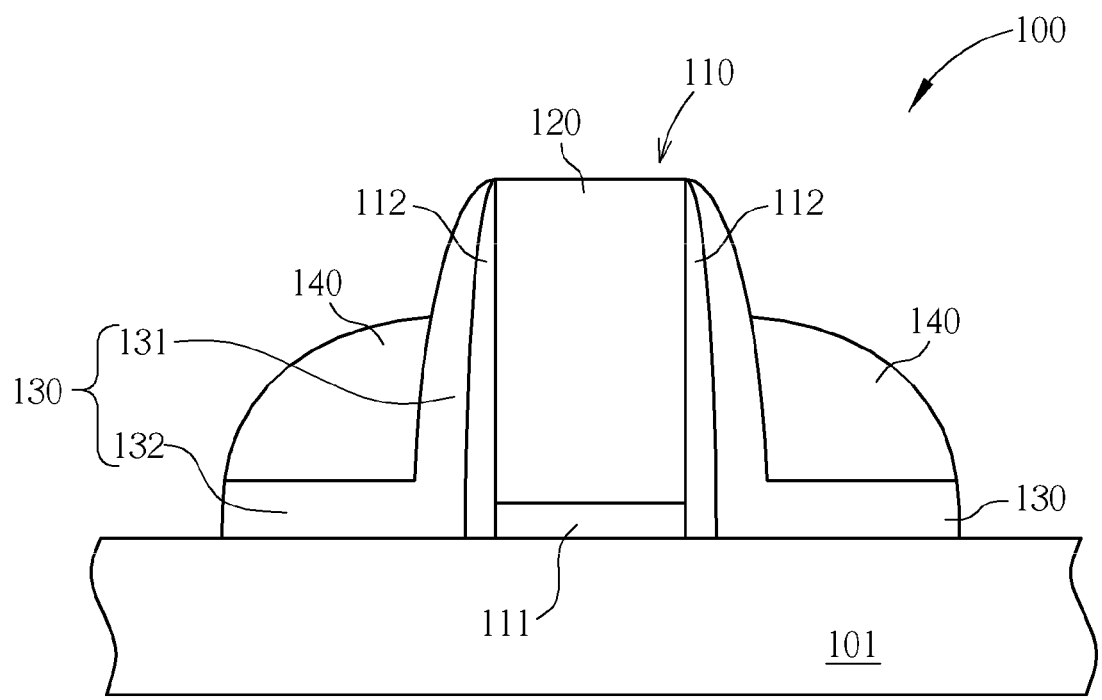

Please refer to FIG. 2, in one preferred embodiment of the present invention, the first spacer 130 and the second spacer 140 have etching selectivity. So, a selective etching is carried out in the trimming procedure to lower the vertical height of the second spacer 140. For example, if the first spacer 130 includes an oxide, the second spacer 140 may include a nitride. A dry or wet etching, such as hot phosphoric acid, may be used to effectively lower the vertical height of the second spacer 140 and to lessen the adverse influence of the new stress on the substrate 101. In such a way, the second spacer 140 is lower than the first spacer 130. The height of second spacer 140 and the first spacer 130 has discontinuous change, as shown in FIG. 2. Preferably, the second spacer 140 after the trimming procedure is still lower than half of the first spacer 130, or half of the gate 120. Or optionally, a wet etching is carried out so that the first spacer 130 is lower than the second spacer 140 to form a set of non-continuous spacers (not shown).

Figure 3:
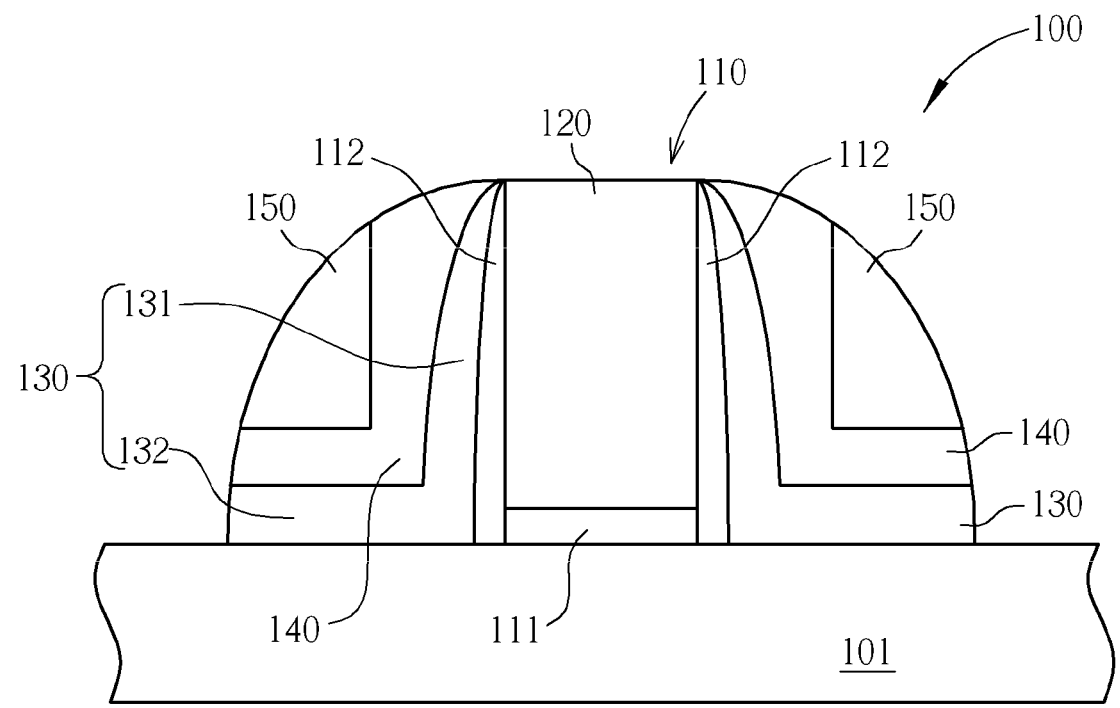

Please refer to FIG. 3, in another preferred embodiment of the present invention, a third spacer 150 is formed on the substrate 101. The third spacer 150 is disposed on the second spacer 140 and surrounding the gate 120, so that the second spacer 140 is also in an L shape and includes a horizontal part and a vertical part. In the mean time, the third spacer 150 has a cross section of D shape, or in other words, the third spacer 150 has a curved sidewall.

Figure 4:
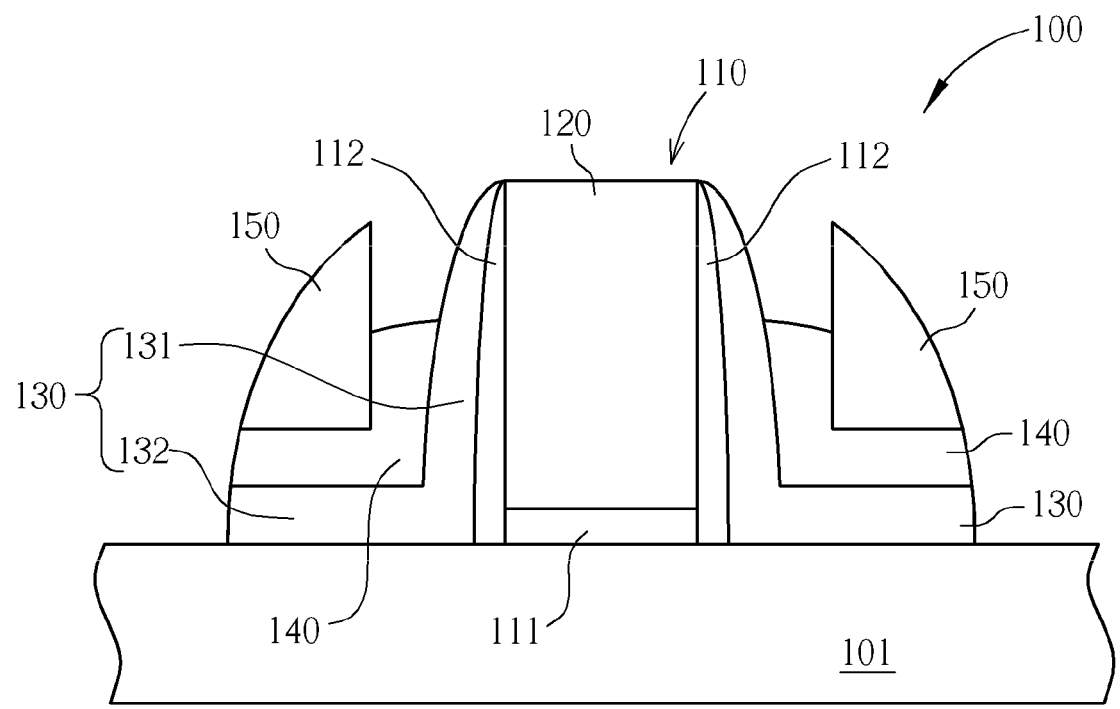

Similarly, the first spacer 130, the second spacer 140 and the third spacer 150 have respective etching selectivity. For example, the second spacer 140 includes a nitride, and the first spacer 130 and the third spacer 150 include an oxide. So, a selective etching is carried out in the trimming procedure to merely lower the vertical height of the second spacer 140, as shown in FIG. 4. Due to the etching selectivity, the second spacer 140 is lower than both the first spacer 130 and the third spacer 150. However, the first spacer 130, the second spacer 140 and the third spacer 150 may independently include silicon oxide or silicon nitride.

In a normal manufacturing process of the MOS, after the completion of the gate structure 110, i.e., the gates and the spacers, a source/drain implanting procedure is usually performed to form source/drain adjacent to the gate structure 110, and further by a RTP procedure. In addition, in order to increase the stress in the gate channel, the stress memorization technique (SMT) may be applied, too. Accordingly, in still another preferred embodiment of the present invention, the trimming procedure can be carried out before the source/drain implanting procedure, or after the source/drain implanting procedure. If the trimming procedure is carried out before the source/drain implanting procedure, it is recommended that sufficient spacers be left to be the mask for the source/drain implanting procedure. If the trimming procedure is carried out after the source/drain implanting procedure, it is recommended that sufficient spacers be optionally removed.

Figure 5:
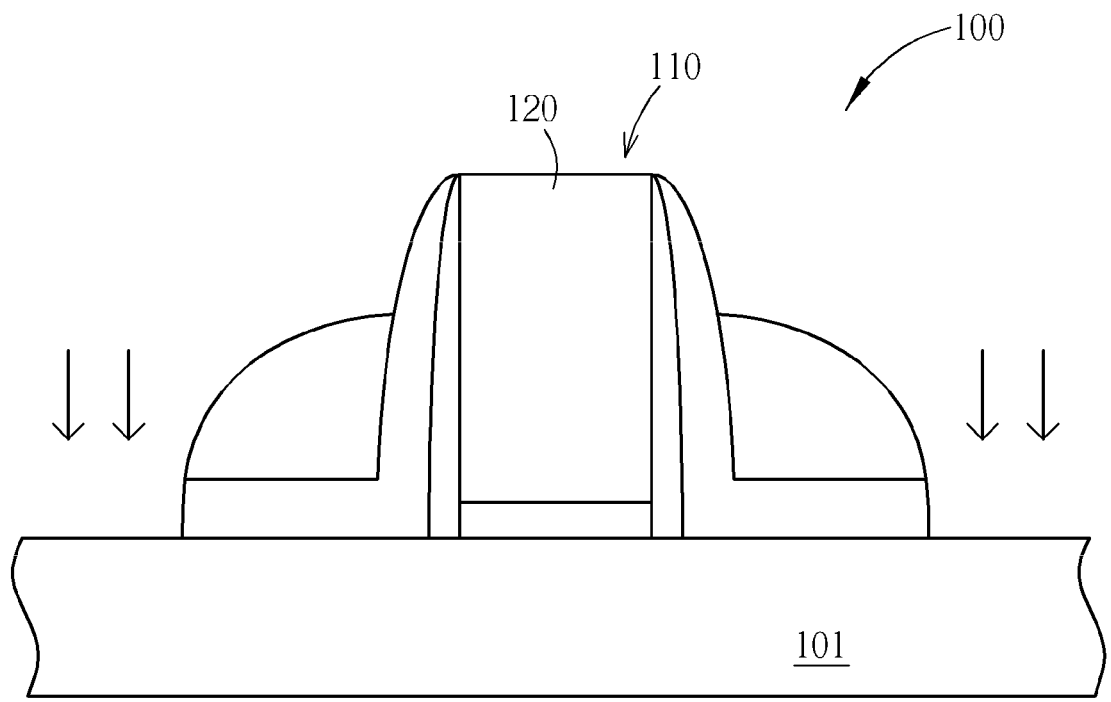
FIGS. 5-8 illustrate preferred examples of forming stress layer of the present invention.
Figure 6:
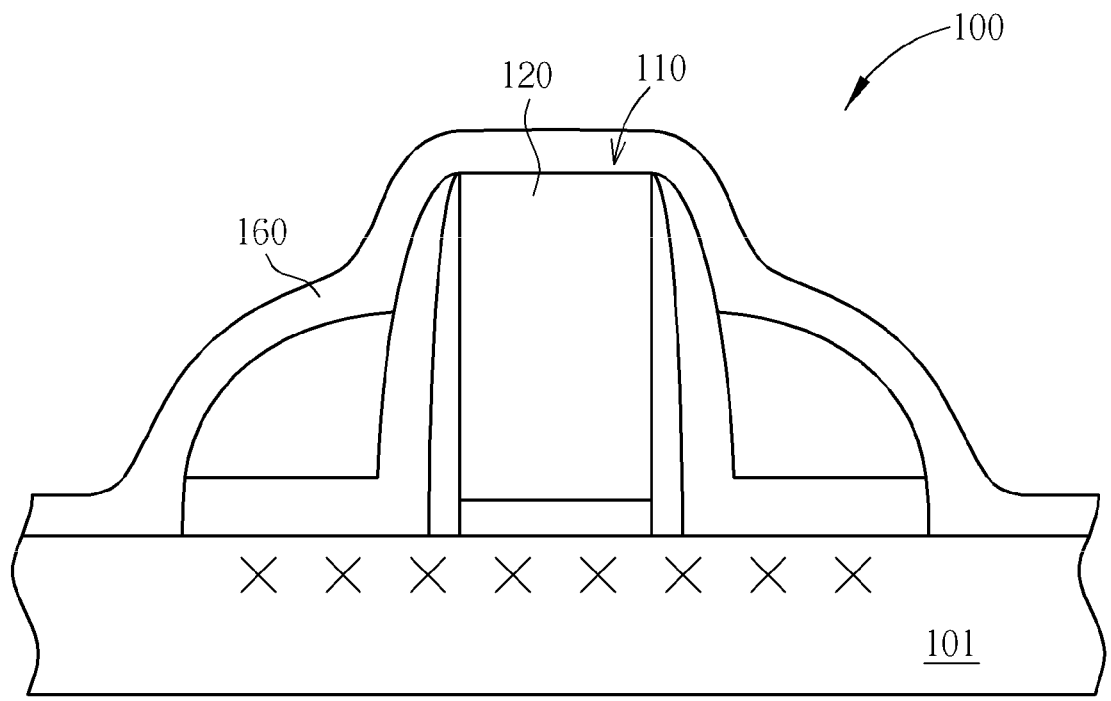
Figure 7:
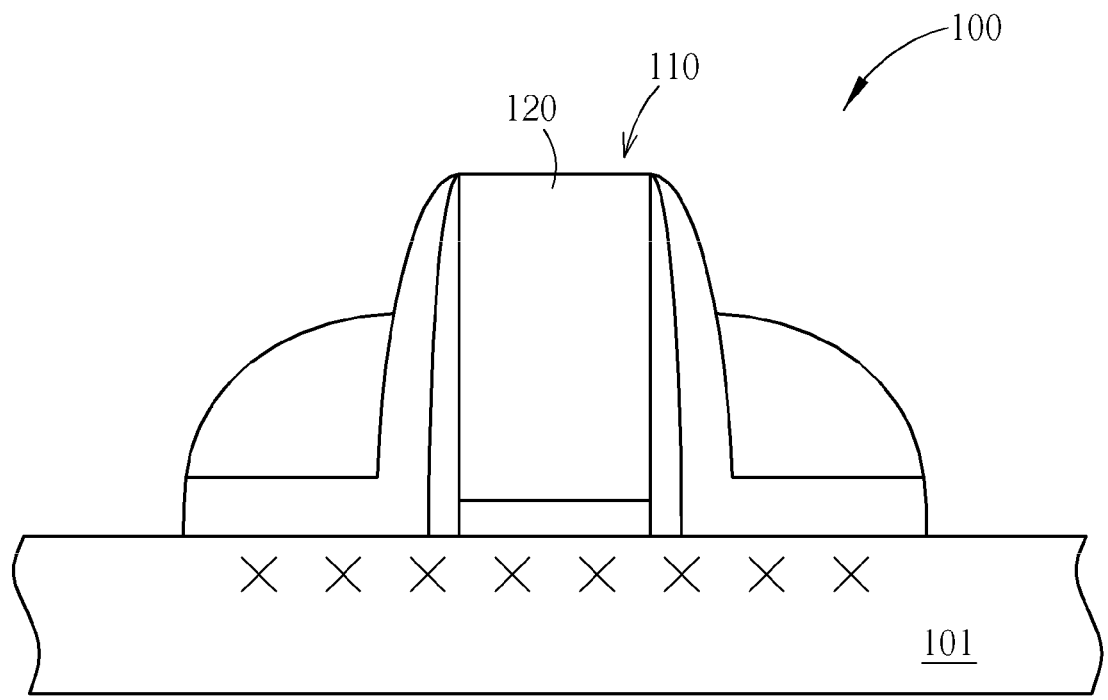

For example, please refer to FIG. 5, if the SMT is used, first a pre-amorphous implant (PAI) is carried out to destroy the surface of the substrate 101. Then, please refer to FIG. 6, stress film deposition is carried out to form a stress film 160. Later, the stress film 160 forms the required stress (marked by x) on the gate channel by annealing. Afterwards, please refer to FIG. 7, the stress film 160 is removed to keep the required stress remained in the gate channel.

Figure 8:
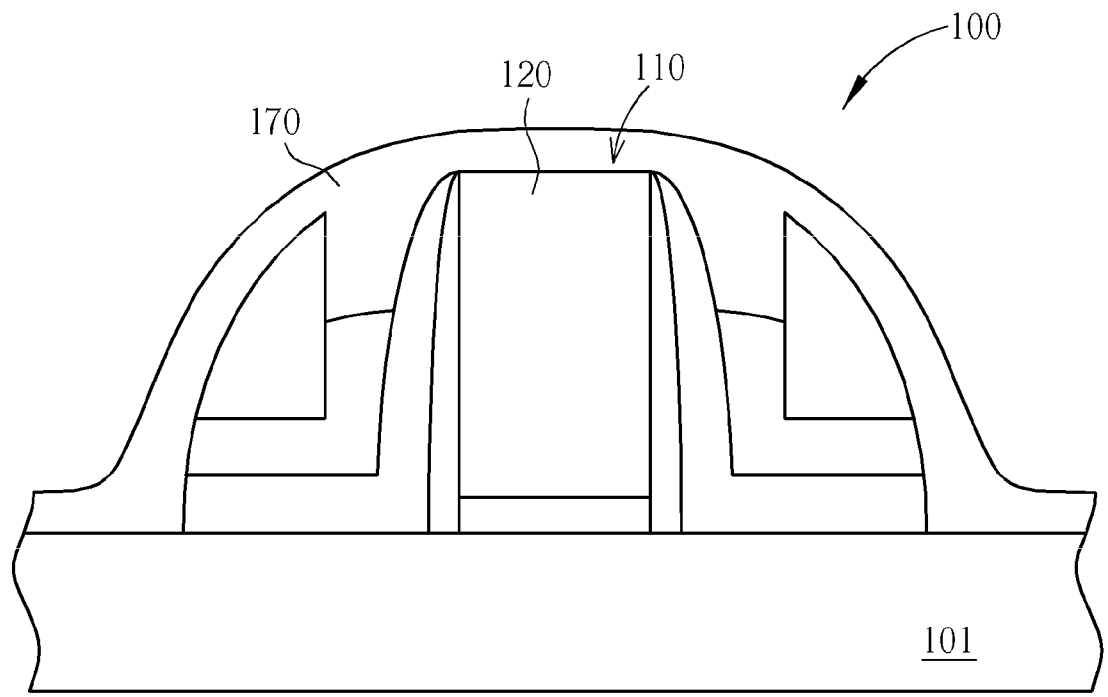

On the other hand, as shown in FIG. 8, a contact etch-stop layer 170 (CESL) is formed to cover the gate structure 110 after the semiconductor structure 100 is completed. The contact etch-stop layer 170 on one aspect serves as an etching-stop layer, and on another aspect, it may form the required stress on the gate channel by a suitable way. Compared with the stress film 160, the contact etch-stop layer 170 is usually not removed.

After the method for trimming spacers of the present invention, a gate structure is consequently obtained. FIGS. 2 and 4 illustrate preferred examples of the gate structure of the present invention. As shown in FIG. 2, the semiconductor structure 100 of the present invention includes a substrate 101 and a gate structure 110. The gate structure 110 includes a gate 120, a first spacer 130 and a second spacer 140. The gate structure 110 is disposed on the substrate 101. In addition, the gate structure 110 may also include a gate insulator 111 and a liner 112. The gate insulator 111 is disposed between the gate 120 and the substrate 101, and usually includes a high-k material and silicon oxide. The liner 112 is disposed between the gate 120 and the first spacer 130, and usually includes a silicon nitride or silicon oxide. The gate insulator 111 and the liner 112 are well known to persons of ordinary skills in the art, and the details will not be discussed here.

The gate 120 is disposed on the substrate 101. The substrate 101 is usually a semiconductor substrate, such as Si. First, the gate 120 is surrounded by the liner 112, then by the first spacer 130, also disposed on the substrate 101. In other words, the liner 112 is disposed between the gate 120 and the first spacer 130. Further, the second spacer 140 is disposed on the first spacer 130 and surrounding the gate 120. The first spacer 130 surrounding the gate structure 110 has a cross section of L shape, that is, the first spacer 130 includes a horizontal part 132 contacting the substrate 101 and a vertical part 131.

In order to lessen the adverse influence of the new stress near the gate 120 by the newly formed second spacer 140 and the first spacer 130 on the substrate 101 and to maintain the nature of the substrate 101, the second spacer 140 is lower than the first spacer 130. Preferably, the second spacer 140 is lower than half of the first spacer 130, to lessen the adverse influence of the new stress on the substrate 101. Even more, the height of second spacer 140 and the first spacer 130 has discontinuous change.

Please refer to FIG. 2, in one preferred embodiment of the present invention, the second spacer 140 has a cross section of D shape, or in other words, the second spacer 140 has a curved sidewall, so the vertical height of the second spacer 140 is less than that of the first spacer 130. For example, if the first spacer 130 includes an oxide, the second spacer 140 may include a nitride. In such a way, the height of second spacer 140 and the first spacer 130 has discontinuous change.

Please refer to FIG. 4, in another preferred embodiment of the present invention, the semiconductor structure 100 of the present invention further includes a third spacer 150. The third spacer 150 is disposed on the second spacer 140 and surrounding the gate 120, so that the second spacer 140 also has a cross section of L shape and includes a horizontal part and a vertical part.

At the same time, the third spacer 150 has a cross section of D shape, or in other words, the third spacer 150 has a curved sidewall, as shown in FIG. 4. In the gate structure 110 of the present invention, the second spacer 140 is lower than both the first spacer 130 and the third spacer 150. For example, if the second spacer 140 includes a nitride, and the first spacer 130 and the third spacer 150 include an oxide.

Those skilled in the art will readily observe that numerous modifications and alterations of the device and method may be made while retaining the teachings of the invention.

What is claimed is:

1. A gate structure, comprising:
   a gate disposed on a substrate;
   a first spacer disposed on said substrate, surrounding said gate and being in an L shape;
   a second spacer disposed on said first spacer and surrounding said gate and having an arc outer sidewall, said second spacer being lower than half of said first spacer, wherein said arc outer sidewall has two ends contacting a horizontal part and a vertical part of said L shape of said first spacer respectively, an outer sidewall of a bottom of said first spacer and said arc outer sidewall of a bottom of said second spacer align with each other, and a top of said first spacer and a top of said second spacer have discontinuous change; and
   a stress film disposed on said gate, wherein said stress film directly contacts to said substrate, said two ends of said arc outer sidewall, and said vertical part of said L shape of said first spacer.

2. The gate structure of claim 1, further comprising:
   a liner disposed between said gate and said first spacer, having a nitride or an oxide.

3. The gate structure of claim 1, wherein said first spacer and said second spacer have etching selectivity.

4. The gate structure of claim 1, wherein said second spacer is lower than said first spacer to expose said vertical part of said L shape of said first spacer.

5. The gate structure of claim 1, wherein said gate structure has only said first spacer and said second spacer.

6. A gate structure, comprising:
   a gate disposed on a substrate;
   a first spacer disposed on said substrate, surrounding said gate and being in an L shape;
   a second spacer disposed on said first spacer and surrounding said gate and in a L shape, said second spacer being lower than half of said first spacer, wherein an outer sidewall of a bottom of said first spacer and an outer sidewall of a bottom of said second spacer align with each other, and a top of said first spacer and a top of said second spacer have discontinuous change; and
   a third spacer disposed on said second spacer and surrounding said gate.

7. The gate structure of claim 6, wherein said third spacer and said second spacer have etching selectivity and said third spacer comprises an oxide or a nitride.

8. The gate structure of claim 6, wherein said second spacer is lower than both said first spacer and said third spacer.

* * * * *